(12) United States Patent
Tsai et al.

(10) Patent No.: US 6,319,814 B1
(45) Date of Patent: Nov. 20, 2001

(54) METHOD OF FABRICATING DUAL DAMASCENE

(75) Inventors: Cheng-Yuan Tsai, Yunlin Hsien; Chih-Chien Liu, Taipei; Juan-Yuan Wu, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/417,830

(22) Filed: Oct. 12, 1999

(51) Int. Cl.[7] .................................................. H01L 21/4763
(52) U.S. Cl. ............................ 438/624; 438/622; 438/638
(58) Field of Search ..................................... 438/618, 620, 438/622, 624, 637–638, 672, 680, 778

(56) References Cited

U.S. PATENT DOCUMENTS

| 5,937,323 | * | 8/1999 | Orczyk et al. ........................ 438/624 |
| 5,968,610 | * | 10/1999 | Liu et al. ............................... 427/579 |
| 6,153,528 | * | 11/2000 | Lan ....................................... 438/697 |
| 6,184,159 | * | 2/2001 | Lou et al. ............................. 438/791 |

FOREIGN PATENT DOCUMENTS 5-226480 * 9/1993 (JP) .

* cited by examiner

Primary Examiner—Carl Whitehead, Jr.
Assistant Examiner—Jamie L. Brophy
(74) Attorney, Agent, or Firm—Thomas, Kayden, Horstemeyer & Risley

(57) ABSTRACT

A method for fabricating dual damascene is to form an undoped silicate glass (USG) liner before forming a fluorinated silicate glass (FSG) layer which serves as an intermetal dielectric (IMD) layer on a semiconductor substrate. As a result, the surface sensitivity is eliminated, while a FSG layer with a more uniform thickness and a higher reliability is obtained. In addition, the USG liner increases the adhesion between the FSG layer and other material layers, while no particles are easily formed thereon.

14 Claims, 4 Drawing Sheets

METHOD OF FABRICATING DUAL DAMASCENE

BACKGROUND OF THE INVENTION

1. Field of Invention

The present invention relates to a fabrication method for a semiconductor. More particularly, the present invention relates to a method for fabricating a dual damascene.

2. Description of Related Art

As integration for integrated circuits (IC) increases, an interconnect design with more than two layers has gradually become the method of choice in many IC processes. An inter-metal dielectric (IMD) layer is often used to isolate between metal layers, while a conducting wire, which connects the top metal layer and the bottom metal layer, is known as a via in the semiconductor industry. The dual damascene process is a technology which involves simultaneously forming the via and the interconnect.

Conventionally, the IMD layer of the dual damascene is made of silicon oxide ($SiO_x$) with a dielectric constant of about 4. To satisfy the need for fast development of the semiconductor industry, where RC delay is reduced to improve the data transfer rate, fluorinated silicon glass (FSG) with a lower dielectric constant (about 3.5) is currently used to replace silicon oxide as a material for forming the IMD layer.

FSG not only reduces the capacitance between interconnects, but is also compatible with the copper interconnect process. A silicon oxy-nitride layer or a silicon nitride layer, which would serve as an etching stop layer and copper diffusion barrier layer, respectively, is usually formed before formation of a FSG layer in the dual damascene process. As a result, a problem such as surface sensitivity, otherwise known as surface dependency, occurs when the FSG layer is formed on the silicon oxy-nitride layer or the silicon nitride layer, and has a serious effect on the subsequent semiconductor process.

FIG. 1 is a schematic, cross-sectional diagram illustrating a conventional process for fabricating dual damascene. First of all, a silicon nitride layer or silicon oxy-nitride layer 101 and a planarized fluorinated silicon glass (FSG) layer 102 are formed in sequence on a substrate 100. A silicon nitride layer or silicon oxy-nitride layer 104 which serves as an etching stop layer and/or diffusion barrier layer is formed on the FSG layer 102, wherein the silicon nitride layer or silicon oxy-nitride layer 104 has an opening. Another FSG layer 106 is then formed on the silicon nitride layer or silicon oxy-nitride layer 104. In order to form a trench 108 and a via opening 110 which expose a conducting layer (not shown), the FSG layers 102 and 106 are etched respectively according to the required pattern of the metal conducting wire. So, an opening constituted of the trench 108 and via opening 110 is formed in the presence of the etching stop layer 104. The trench 108 and the via opening 110 are then filled with a conducting layer 109. Hence, the dual damascene process is the process which forms both the trench 108 and the via opening 110 as described.

However, FSG may not have a uniform deposition thickness on the chip surface and there may be a problem of surface sensitivity when the FSG layer is deposited on the silicon nitride layer or silicon oxy-nitride etching stop layer. As the FSG layer does not have a uniform thickness, the subsequent semiconductor process is affected.

SUMMARY OF THE INVENTION

The invention provides a method for fabricating a dual damascene, which method involves providing a substrate with a conducting layer formed within, wherein the conducting layer and the substrate have the same surface levels. A first undoped silicon glass (USG) liner is formed on the conducting layer and the dielectric layer followed by forming a FSG layer on the first USG liner. A stop layer which has an opening for exposing a part of the first FSG layer is formed on the first FSG layer, wherein the opening is located above the conducting layer. A second USG liner is formed to cover the stop layer and to fill the opening before forming a second FSG layer on the second USG liner. With the stop layer serving as an etching stop layer, the second FSG layer and the second USG liner are patterned to form a trench which exposes a part of the first FSG layer. The first FSG layer and the first USG liner are etched to form a via opening which exposes a part of the conducting layer. The first and the second USG liners have a thickness of about 100–500 angstroms.

As embodied and broadly described herein, the invention provides a method for fabricating an IMD layer, where a USG liner is formed on a substrate. A FSG layer is then formed on the USG liner, wherein the USG liner has a thickness of about 100–500 angstroms.

According to the present invention, a method applicable to the silicon nitride/silicon oxy-nitride layer on the substrate is provided for changing the surface condition. The method involves forming an USG liner on the silicon nitride/silicon oxy-nitride layer, followed by forming a FSG layer on the USG liner, wherein the USG liner has a thickness of about 100–500 angstroms.

In the present invention, a USG liner is formed before formation of the FSG layer, so that the surface condition between the silicon nitride/silicon oxy-nitride layer and the FSG layer is changed, while the surface dependence between the silicon nitride/silicon oxy-nitride layer and the FSG layer is eliminated. As a result, the thickness uniformity of the FSG layer is improved.

Furthermore, the USG liner also improves the adhesion between the FSG layer and other material layers.

According to the present invention, the USG liner is formed before deposition of the FSG layer. Experimental findings show that the problem of occurring particles on the chip is reduced during the fabrication process. Also, the USG liner disclosed in the invention changes the surface condition between the silicon nitride/silicon oxy-nitride layer and the FSG layer to make the subsequent FSG deposition easier. Although the USG liner has a dielectric constant approximately higher than that of the FSG layer, the USG liner with small thickness does not have a great impact on the effective dielectric constant of the whole integrated IMD layer. Also, the USG liner can improve the stability of the FSG layer in the following thermal cycle.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A to 2H are schematic, cross-sectional diagrams illustrating steps for fabricating the dual damascene according to one preferred embodiment of this invention.

Figure 1:
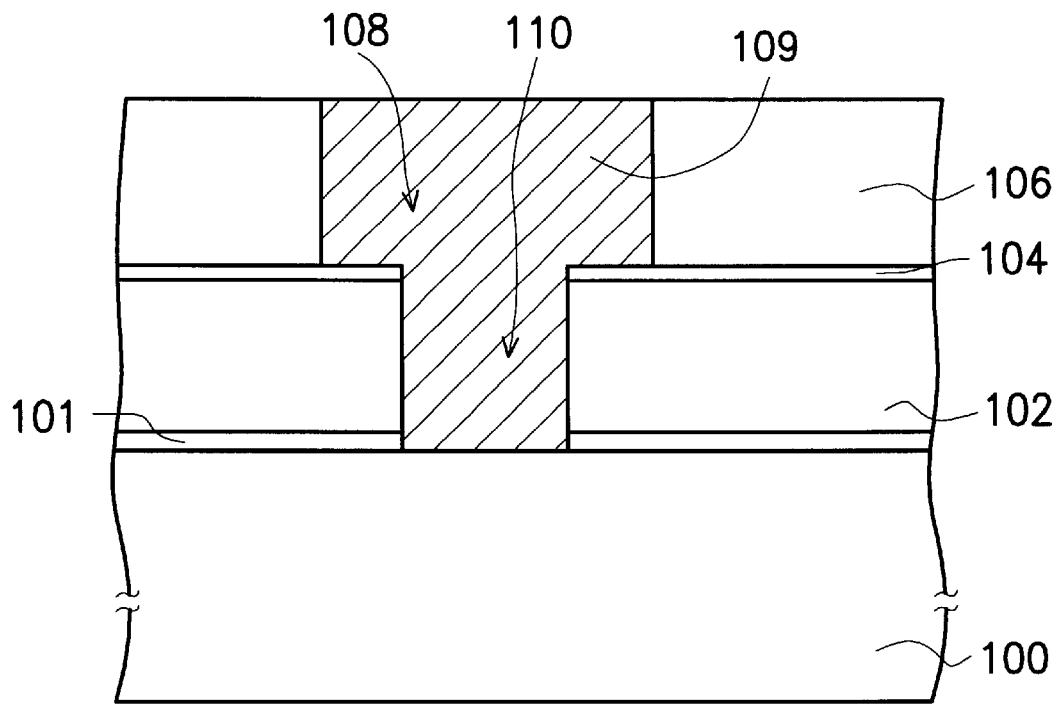
FIG. 1 is a schematic, cross-sectional diagram illustrating a conventional method for fabricating the dual damascene.
Figure 2A:
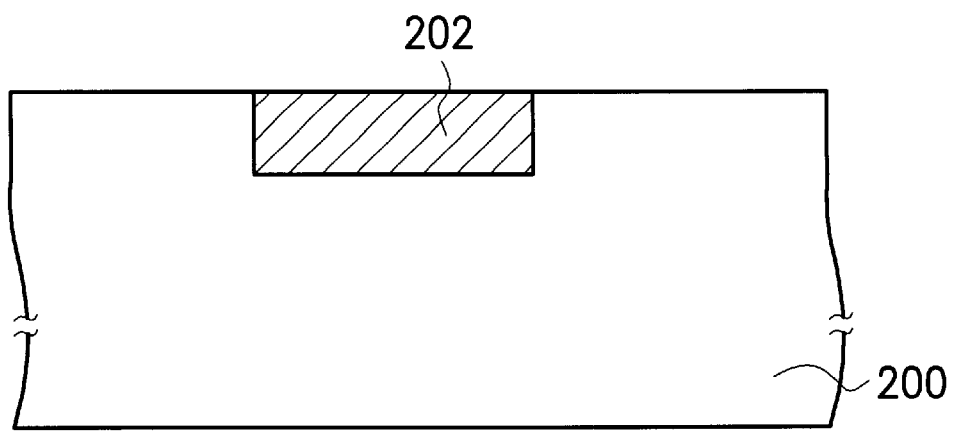
FIGS. 2A to 2H are schematic, cross-sectional diagrams illustrating steps for fabricating the dual damascene according to one preferred embodiment of this invention.

Referring to FIG. 2A, a semiconductor substrate 200 is provided (not all the devices in the substrate 200 are shown) with a conducting layer 202 formed within, wherein the conducting layer 202 and the substrate 200 have the same surface level. The conducting layer 202 in this case may include material, such as metal.

Figure 2B:
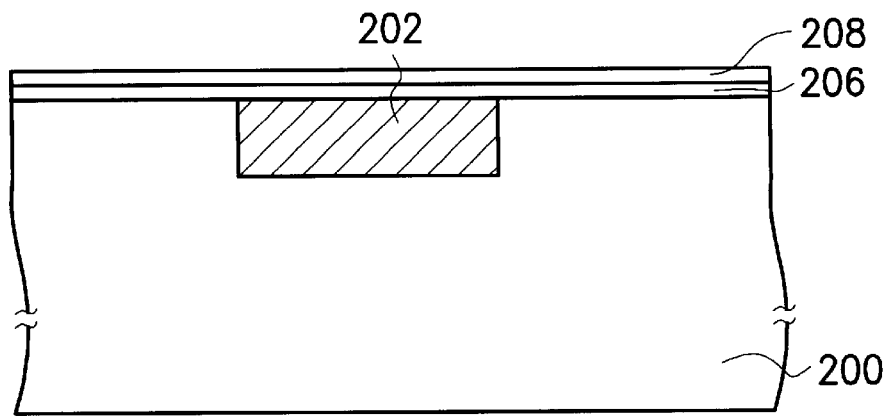

Referring to FIG. 2B, a stop layer 206, such as a silicon nitride layer or a silicon oxy-nitride layer is formed by chemical vapor deposition (CVD) on the substrate 200. A undoped silicon glass (USG) liner 208 is formed on the stop layer 206, wherein the USG liner 208 has a thickness of about 100–500 angstroms and preferably of about 200–400 angstroms. The USG liner 208 is formed by a method such as high-density plasma chemical vapor deposition (HDPCVD).

The USG liner 208 in this case enables change to the surface condition between the stop layer 206 and a FSG layer that is formed subsequently, so that the following process is made easier. Since the USG liner 208 has a dielectric constant of about 4.1, it does not affect the dielectric constant of the whole inter-metal dielectric (IMD) layer because the USG liner 208 is relatively thinner.

Figure 2C:
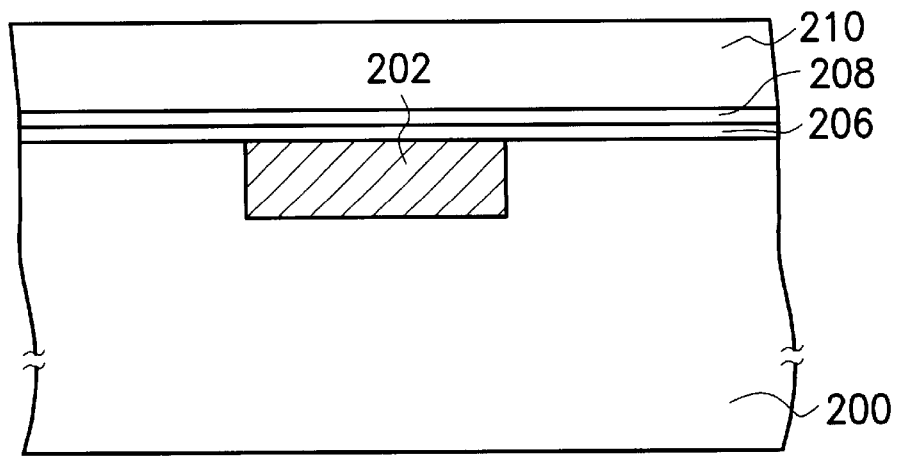

Referring to FIG. 2C, a dielectric layer 210 is formed on the USG liner 208, wherein the dielectric layer 210 includes fluorinated silicate glass (FSG) having a dielectric constant of about 3.5. The method for forming the dielectric layer 210 includes unbiased-unclamped HDPCVD. The unbiased in this case indicates no bias power and no ion bombardment are introduced during HDPCVD, while unclamped indicates no cooling device is clamped to the back end of the semiconductor substrate 200 or no cooling step is performed for the semiconductor substrate 200 during HDPCVD.

Since the USG liner 208 is formed to change the surface condition between the stop layer 206 and the FSG dielectric layer 210 before formation of the FSG dielectric layer 210, the surface dependence between the stop layer 206 and the FSG dielectric layer 210 is eliminated. As a result, the FSG dielectric layer 210 with an uniform thickness is obtained, while the reliability of the FSG dielectric layer 210 is improved. According to the experimental result, the thickness difference of the FSG dielectric layer 210 is smaller than about 0.5%, 1 sigma. Therefore, the addition of the USG liner 208 can intrinsically improve the thickness uniformity of the FSG dielectric layer 210.

Furthermore, the USG liner 208 disclosed in the invention improves the adhesion between the stop layer 206 and the FSG dielectric layer 210. Experimental findings show that the chance of particles occurring on the chip is reduced when the USG liner 208 is formed before deposition of the FSG dielectric layer 210. Thus, the particle performance is improved.

Figure 2D:
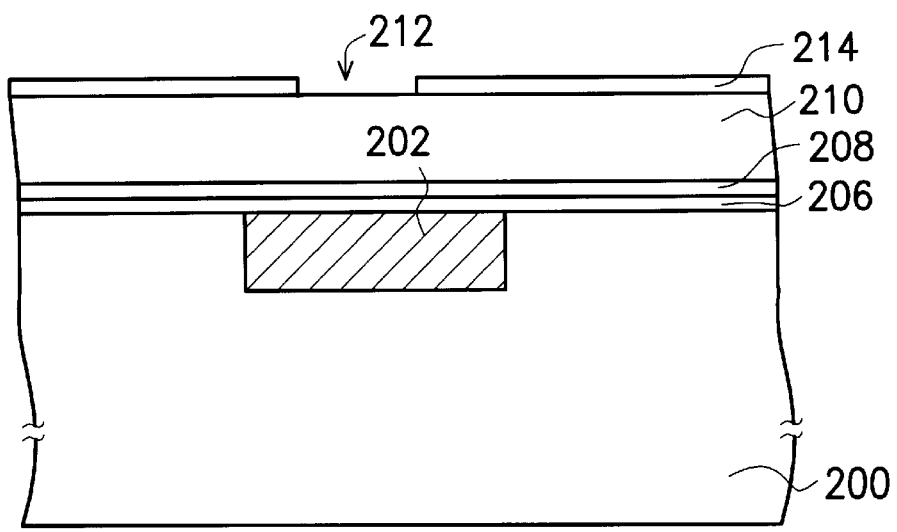

Referring to FIG. 2D, an etching stop layer 214 having an opening 212 is formed on the FSG dielectric layer 210, wherein the etching stop layer 214 includes silicon nitride or silicon oxy-nitride. The opening 212 is formed in the etching stop layer 214 by photolithography and etching, so that the opening exposes a part of the dielectric layer 210. The opening 212 is located above the conducting layer 202 and corresponds to the position for subsequently forming a via opening in the dielectric layer 210.

Figure 2E:
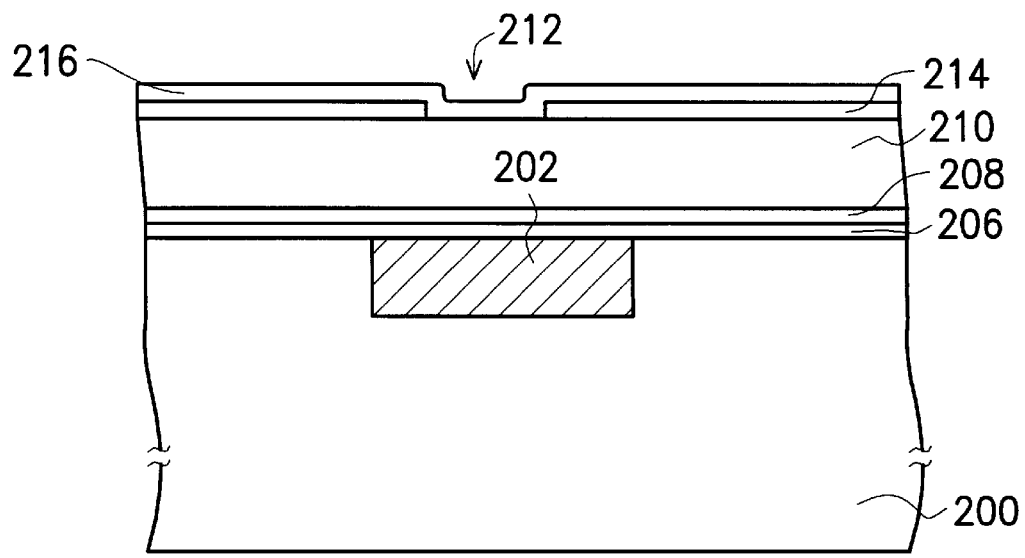

Referring to FIG. 2E, another USG liner 216 is formed to cover the etching stop layer 214 and to fill the opening 212, wherein the USG liner 216 has a thickness of about 100–500 angstroms and preferably of about 200–400 angstroms. The USG liner 216 is formed by a typical method such as HDPCVD. According to the method described above, the USG liner 216 also changes the surface condition between the etching stop layer 214 and a FSG dielectric layer 218 that forms subsequently to make the following process more feasible.

Figure 2F:
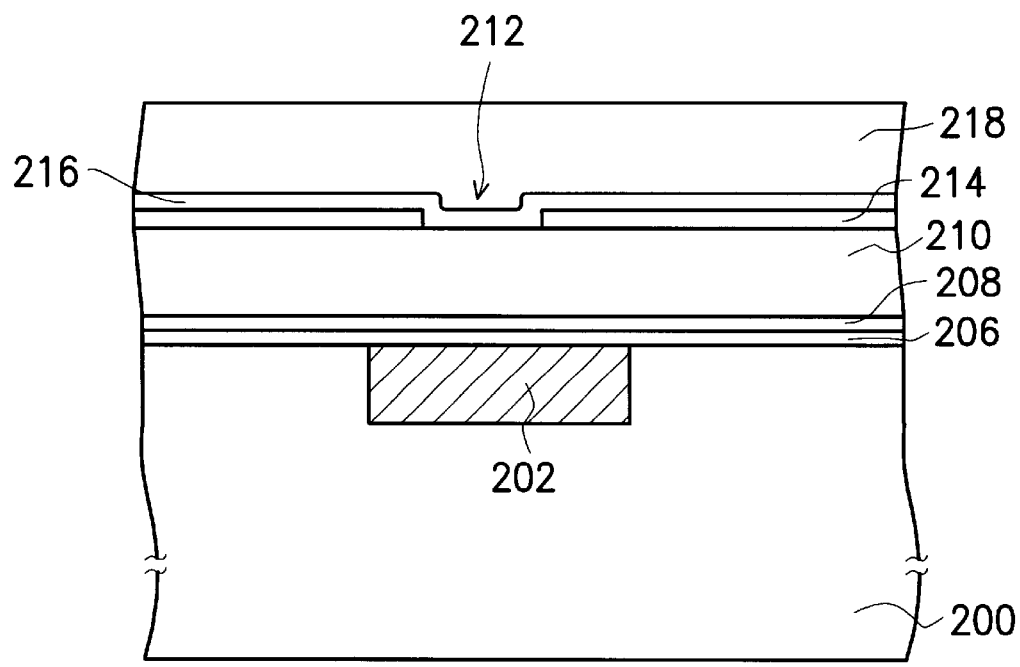

Referring to FIG. 2F, another dielectric layer 218 is formed on the USG liner 216, wherein the dielectric layer 218 may include FSG formed by unbiased-unclamped HDPCVD, with the dielectric constant of FSG being about 3.5. Although the dielectric constant of USG (about 4.1) is higher than the dielectric constant of FSG, the dielectric constant of the whole IMD layer is not significantly affected because the USG liner 216 has a small thickness. Also, the provision of the USG liner 216 in this case improves the stability of the FSG dielectric layer 218 during subsequent thermal cycle.

The USG liner 216 is formed before formation of the FSG dielectric layer 218, so that the surface sensitivity is eliminated, while the FSG dielectric layer 218 with a more reliable property and more uniform thickness is obtained. Furthermore, the adhesion between the etching stop layer 214 and FSG dielectric layer 218 is improved.

Figure 2G:
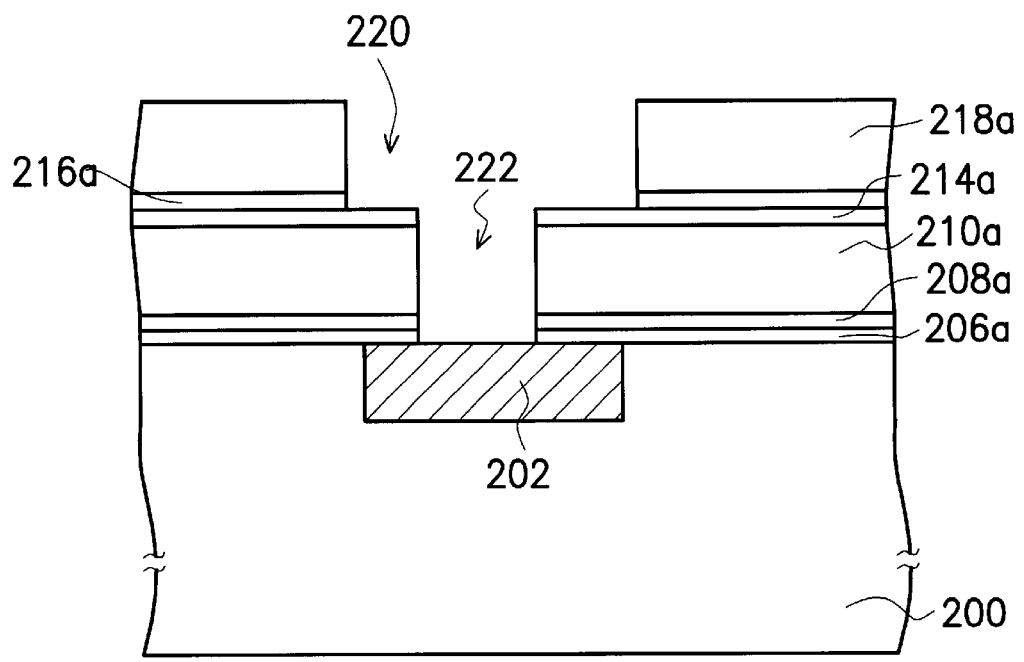

Referring to FIG. 2G, the FSG dielectric layer 218 and the USG liner 216 are patterned by photolithography and etching. For example, a trench 220 for forming conducting wire is patterned using a process such as reactive ion etching (RIE) in the dielectric layer 218a and the USG liner 216a. The trench 220 exposes a part of the FSG dielectric layer 210 and aligns to the position where the via opening is subsequently formed. The FSG dielectric layer 210 and the USG liner 208 are etched, so that a dielectric opening 222 which exposes a part of the conducting layer 202 is formed in the FSG dielectric layer 210a and the USG liner 208a.

Figure 2H:
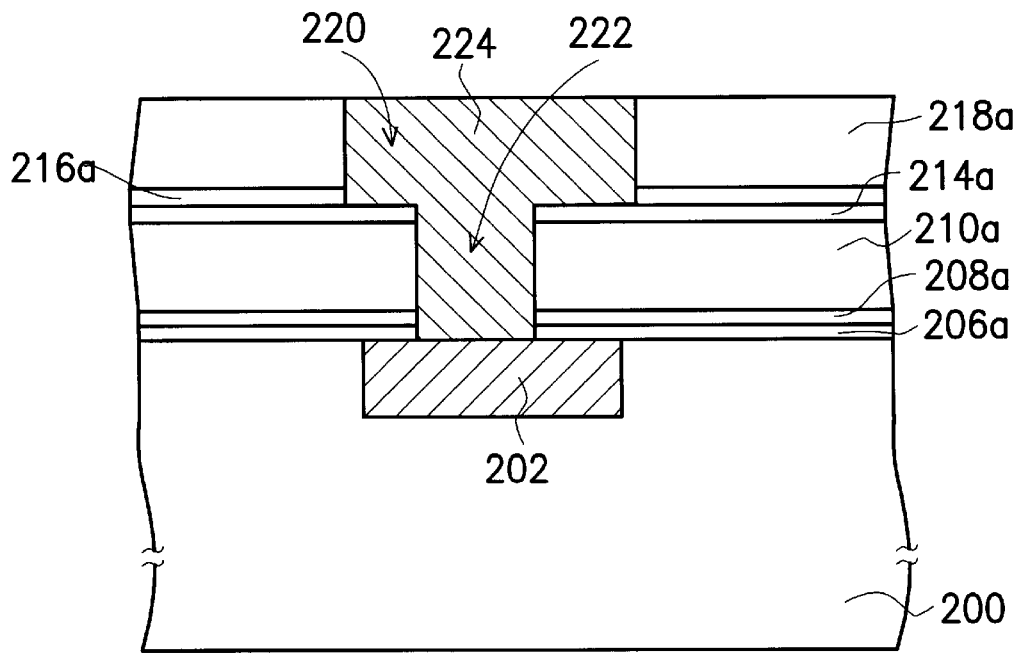

Referring to FIG. 2H, a conducting layer is formed to fill the trench 220 and the via opening 222, wherein the conducting layer may include copper. A planarization process is performed to remove excessive conducting layer, so that a conducting layer 224 is formed as illustrated in the diagram, wherein the planarization process includes process such as chemical mechanical polishing (CMP). Therefore, the dual damascene process is completed.

Summarizing from above, it is understood that the invention has the following advantages. In the present invention, an USG liner is formed before the FSG layer, so that the property between the silicon nitride/silicon oxy-nitride layer and the FSG layer is changed, while the surface sensitivity between the silicon nitride/silicon oxy-nitride layer and the FSG layer is eliminated. As a result, the thickness uniformity of the FSG layer is improved. In addition, the USG liner is formed between the silicon nitride stop layer or silicon oxy-nitride stop layer and FSG layer to improve the adhesion between the layers. According to the present invention, the USG liner is formed before deposition of the FSG layer, so that incidence of particles falling on the chip is reduced during the process. The USG liner disclosed in the invention also changes the surface property between the silicon nitride/silicon oxy-nitride layer and the FSG layer to make the following FSG deposition process more feasible.

Although the dielectric constant of the USG liner is higher than that of the FSG layer, the USG liner with a small thickness does not have a great impact on the dielectric constant of the overall IMD layer. Also, the USG liner is provided to improve the stability of the FSG layer during thermal cycle.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a dual damascene, comprising steps of:
   providing a substrate;
   forming a first undoped polysilicon glass (USG) liner on the substrate;
   forming a first fluorinated silicon glass (FSG) layer on the first USG liner;
   forming a stop layer having an opening on the first FSG layer, so that a part of the first FSG layer is exposed;
   forming a second USG liner to cover the stop layer and to fill the opening;
   forming a second FSG layer on the second USG liner;
   patterning the second USG liner and the second FSG layer using the stop layer as a stop to form a trench exposing a portion of the first FSG layer exposed by the stop layer;
   patterning the first FSG layer and the first USG layer exposed by the stop layer to form a via opening which exposes a part of a conductive layer.

2. The fabrication method of claim 1, wherein the method for forming the first USG liner and the second USG liner includes high-density plasma chemical vapor deposition (HDPCVD).

3. The fabrication method of claim 1, wherein the first USG liner has a thickness of about 100–500 angstroms.

4. The fabrication method of claim 1, wherein the second USG liner has a thickness of about 100–500 angstroms.

5. The fabrication method of claim 1, wherein the method for forming the first FSG layer and the second FSG layer includes unbiased-unclamped HDPCVD.

6. The fabrication method of claim 1, wherein the stop layer includes silicon oxy-nitride.

7. The fabrication method of claim 1, wherein the stop layer includes silicon nitride.

8. The fabrication method of claim 1, further including forming a silicon nitride layer before forming the first USG liner.

9. The fabrication method of claim 1, further including forming a silicon oxy-nitride layer before forming the first USG liner.

10. The fabrication method of claim 1, further including filling the via opening and the trench with a copper layer after formation of the via opening.

11. A method for fabricating a inter-metal dielectric (IMD) layer, comprising steps of:
    providing a silicon nitride or silicon oxy-nitride layer;
    forming a USG liner on the silicon nitride or silicon oxy-nitride layer; and
    forming a FSG layer on the USG liner.

12. The fabrication method of claim 11, wherein the method for forming the USG liner includes HDPCVD.

13. The fabrication method of claim 11, wherein the USG liner has a thickness of about 100–500 angstroms.

14. The fabrication method of claim 11, wherein the method for forming the FSG layer includes unbiased-unclamped HDPCVD.

* * * * *